United States Patent [19]

Maddox et al.

[11] Patent Number: 4,475,034
[45] Date of Patent: Oct. 2, 1984

[54] MODULAR SHAFT ENCODER

[75] Inventors: Randall A. Maddox, Georgetown; Joseph W. Rudolph, Lexington, both of Ky.

[73] Assignee: International Business Machines Corporation, Armonk, N.Y.

[21] Appl. No.: 391,776

[22] Filed: Jun. 24, 1982

[51] Int. Cl.³ .............................................. G01D 5/34
[52] U.S. Cl. ........................... 250/231 SE; 340/347 P
[58] Field of Search ............. 250/231 SE, 237 G, 239; 356/39 S; 340/347 P

[56] References Cited

U.S. PATENT DOCUMENTS 4,342,909  8/1982  Accatino ....................... 250/231 SE
4,445,112  4/1984  Haville ........................... 340/347 P Primary Examiner—David C. Nelms
Attorney, Agent, or Firm—William J. Dick

[57] ABSTRACT

Disclosed is an optical encoder structure which is easily attached to a motor case and shaft in either the factory or field, and which automatically achieves, by its construction, both axial and radial alignment. This is achieved by first securing to a housing by a novel latch, a mounting plate which is spaced a predetermined distance from the housing. A rotatable encoder disc, having a conically shaped hub is placed in an aperture in the housing, the conically shaped hub serving to self center the disc radially relative to the housing. The assembly is pushed onto the motor shaft, and the disc is secured to the shaft. The plate is then attached to the motor case and the housing rotated. This moves the housing into an abutting relationship with the plate and spaces the housing a predetermined distance from the disc. Thus the disc is both axially and radially positioned, no instruments being required to accurately position the housing with respect to the disc or motor. Moreover, so that no electrical adjustment is necessary in either the field or in the factory, the aperture for the mask or slits of the stationary member of the optical encoder and the transparent or slit openings on the rotating member are made equal to the period of the rotating disc pattern divided by two. This creates a half-wave rectified analog waveform which in conjunction with direct feedback of the voltage created by the analog waveform to control the code cycle, operational amplifier saturation is inhibited.

15 Claims, 11 Drawing Figures

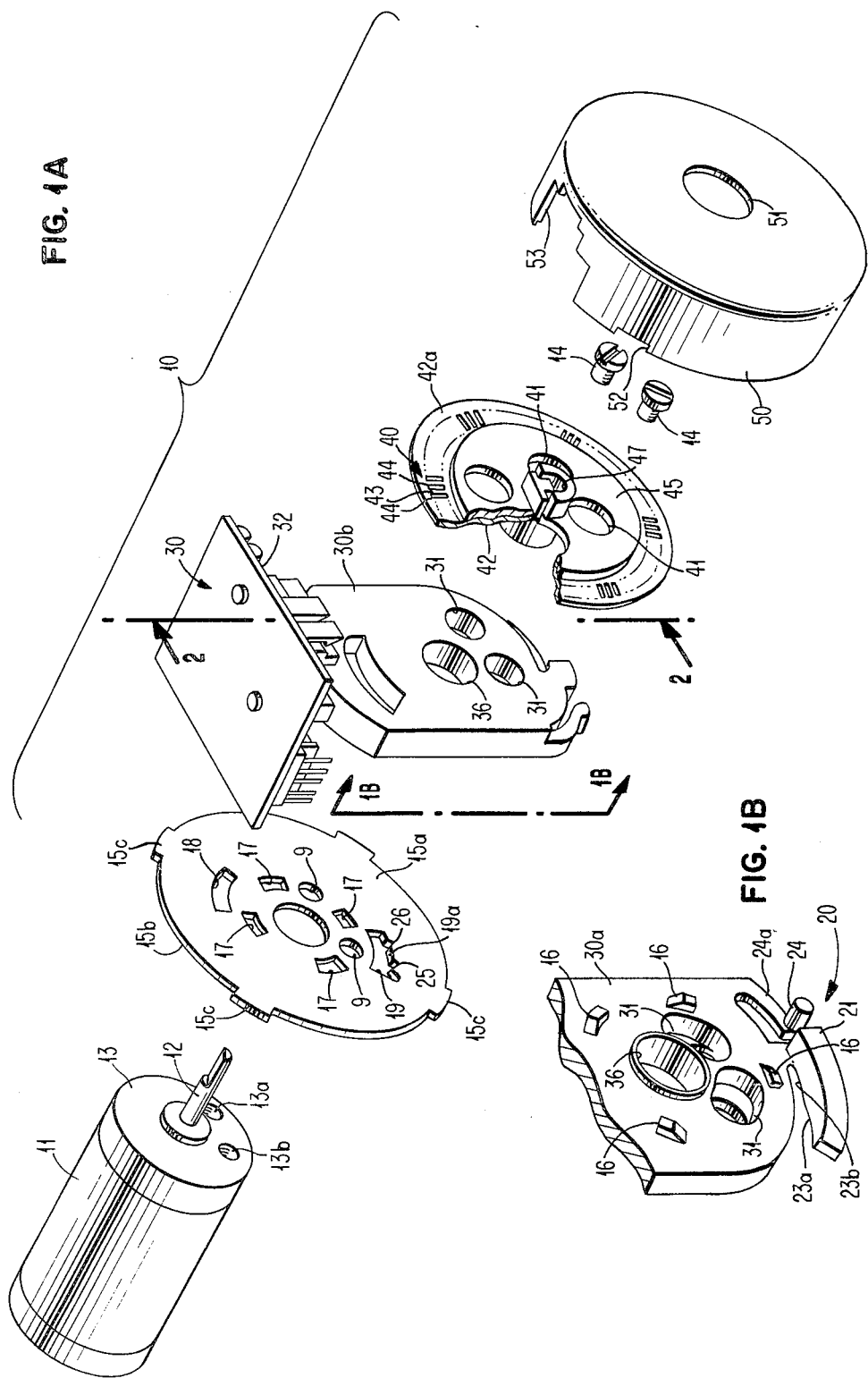

MODULAR SHAFT ENCODER

SUMMARY OF THE INVENTION AND STATE OF THE PRIOR ART

The present invention relates to an optical encoder structure which is easily attached to a motor case and shaft in either the factory or field, and which automatically achieves, by its construction, both axial and radial alignment.

In two channel shaft encoders useful for providing an optical-electrical feedback indicative of shaft position, velocity and direction of rotation, the rotating disc pattern must be concentric to the stationary mask pattern, within allowable tolerances, in order to reduce shaft position errors and to reduce phase errors. This alignment problem is not trivial because the rotating disc is attached to the motor shaft and the stationary mask is attached to the motor case, yet no concentric reference exists between the two members.

The axial location of the disc with respect to the stationary mask pattern is equally important. The disc must rotate closely adjacent the mask to inhibit crosstalk and phase errors between channels. Yet the mask and disc must accommodate disc wobble and axial end play of the motor shaft.

With existing commercial encoders, customarily radial alignment must be accomplished with the aid of an oscilloscope or phase meter. Conventionally, special tools are required for both radial and axial adjustments. Moreover, axial end play must be removed from the motor shaft, prior to encoder mounting. All of these factors make it difficult if not impossible to replace an encoder in the field.

In view of the above, it is a principal object of the present invention to provide a low cost shaft encoder design which can be installed in the factory or in the field, requiring no adjustments for axial location of the disc and no adjustments for radial alignment between the mask and disc.

It is a further object of the present invention to provide a shaft encoder which is easy to install and requires no special tools or special test equipment for installation.

In U.S. patent application Ser. No. 218,513, filed on Dec. 19, 1980, entitled "Incremental Rotary Encoder," by Cox and Maddox, is described a method and apparatus for eliminating radial and axial adjustments of a rotary shaft encoder. This technique utilizes the inner and outer races of a ball bearing for reference surfaces. If a sleeve bearing is employed, it is difficult to use this technique.

The apparatus of the present invention is capable of use under any circumstances and achieves the above identified meritorious objects by: (1) securing a mounting plate to a housing by a special latch and including means for maintaining the plate a predetermined distance from the housing: (2) placing in an aperture in the housing, a rotatable encoder disc, having a conically shaped hub, the conically shaped hub serving to self-center (radially align) the disc relative to the housing; (3) pushing the assembly onto the motor shaft, and securing the disc to the shaft; (4) attaching the plate to the motor casing and rotating the housing moves the housing into abutting relationship with the plate and spaces the housing the predetermined distance from the disc. Thus, the disc is both axially and radially positioned, no instruments being required to accurately position the housing with respect to the disc or motor.

Also disclosed is a signal generation and detection technique for the encoder in which the aperture for the mask or slits of the stationary member of the encoder, plus the transparent or slit opening on the rotating member are equal to P/2 where P=the period of the rotating disc pattern. This relationship creates a "half-wave" rectified waveform. It is recognized that a particular relationship which is of the same form as the discovery is set forth in U.S. Pat. No. 3,723,748 in which the disc opening=the mask opening, which means that each opening is equal to the period P divided by four.

Moreover, by utilizing direct feedback of the voltage created by the analog waveform from the rotating disc to control each code cycle, operational amplifier saturation is prevented inhibiting the necessity for any preadjustment or field adjustment upon initial installation or when replacement is required. Thus the discovery of the proper aperture to disc-transparent-opaque period relationship coupled with the prevention of amplifier saturation makes unnecessary any thresholding adjustments.

These and other objects and advantages of the invention may be seen upon a closer examination of the accompanying specification and claims taken in conjunction with the accompanying drawings in which:

FIG. 1A is a fragmentary, exploded, perspective view illustrating a modular shaft encoder constructed in illustrating a modular shaft encoder constructed in accordance with the present invention;

FIG. 1B is a fragmentary perspective view of the reverse side of a portion of the apparatus illustrated in FIG. 1A;

Figure 6:
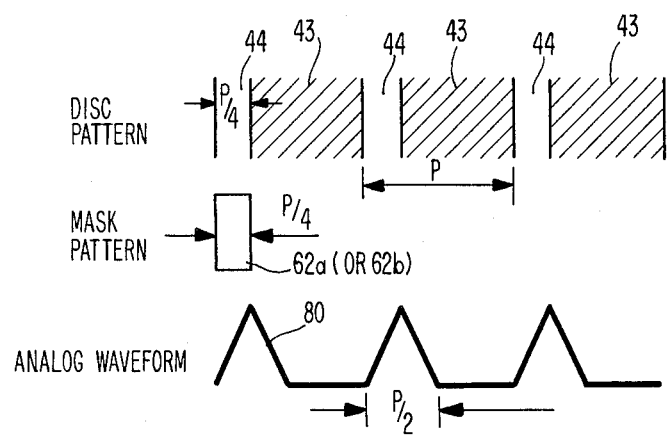
Figure 7:
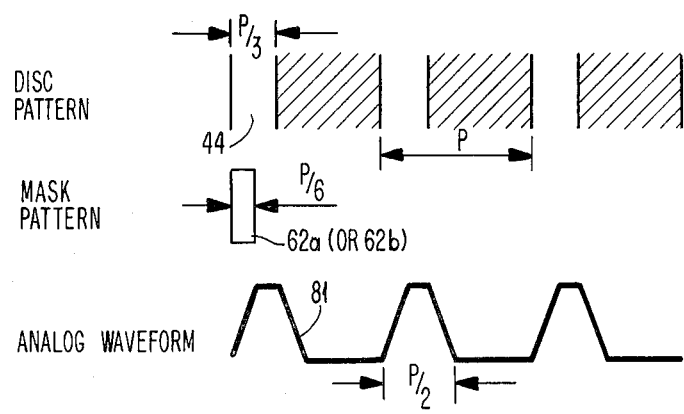
Figure 8:
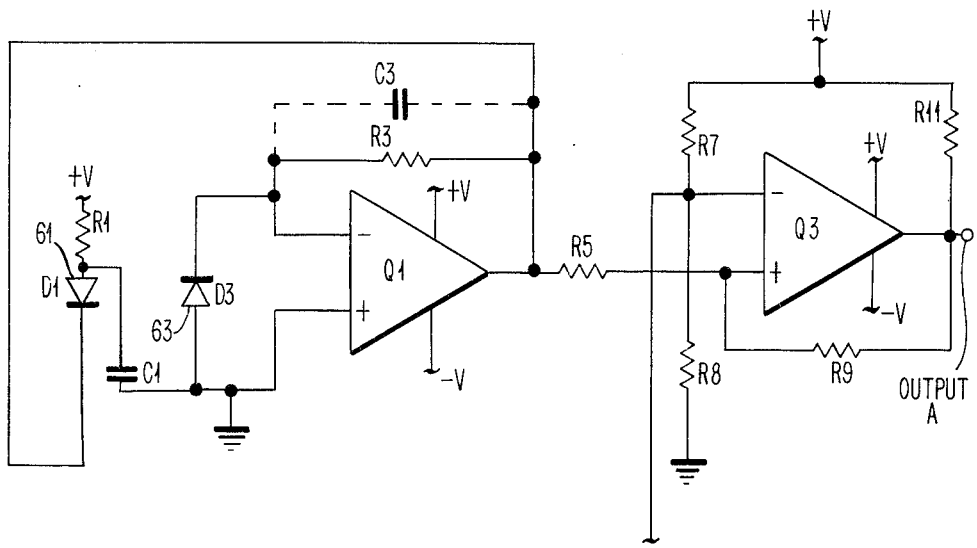

FIG. 6 schematically illustrates the relationship between the period of the disc pattern and the disc and slit or mask opening, and the convolution (analog waveform) resulting therefrom;

FIG. 7 is another example of an analog waveform created with another disc and mask opening and showing the preferred relationship;

FIG. 8 is a schematic diagram of a feedback limiter amplifier and comparator for obtaining a useful output from the encoder of the present invention.

THE SPECIFICATION

General Construction

Referring now to the drawings and especially FIG. 1 thereof, a modular shaft encoder 10 constructed in accordance with the present invention, is illustrated therein. As shown, the encoder 10 includes a plate or the like 15 which cooperates with means on a housing 30 for setting the plate a predetermined distance from one side 30a of the housing with an encoder disc 40 flush against the second side 30b of the housing 30. When the disc 40 is connected to a rotatable shaft 12, for example of a motor 11, the plate 15 may be connected to the motor casing 13 as by screws 14 which fit through suitable holes 41, 31, respectively in the disc 40 and housing 30. The housing 30 is then rotated and the predetermined distance is now transferred from the side between the plate 15 and the housing 30 to the opposite side, i.e., between the disc 40 and the housing 30. In this manner the disc 40 is axially as well as radially aligned with the housing and with respect to the motor shaft.

Figure 2B:
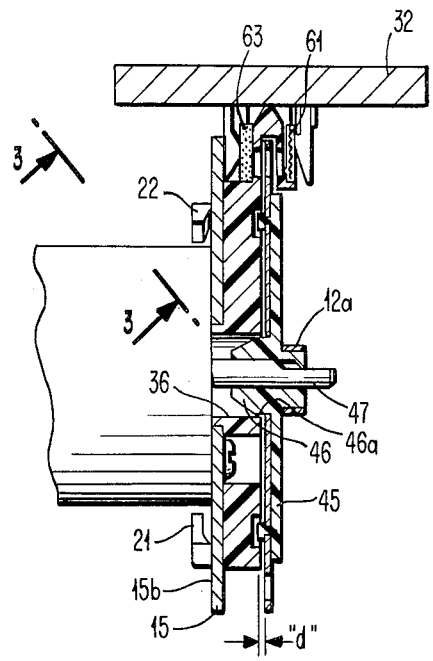
FIG. 2B is a fragmentary sectional view taken along line 2—2 of FIG. 1, similar to that shown in FIG. 2A, and illustrating the parts in another or second position.
Figure 2A:
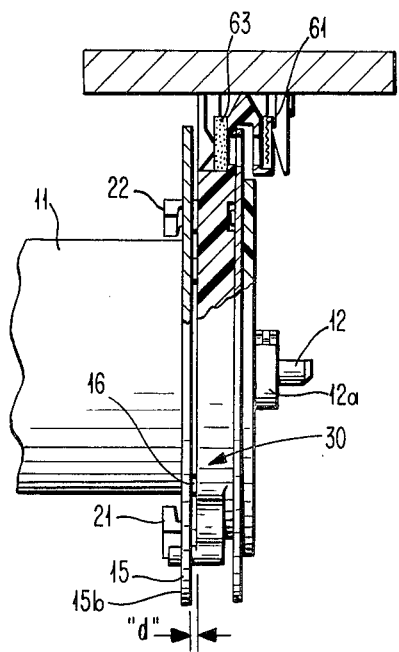
FIG. 2A is a fragmentary sectional view taken along line 2—2 of FIG. 1 and showing the various parts of the encoder of the present invention in a first position.
Figure 3:
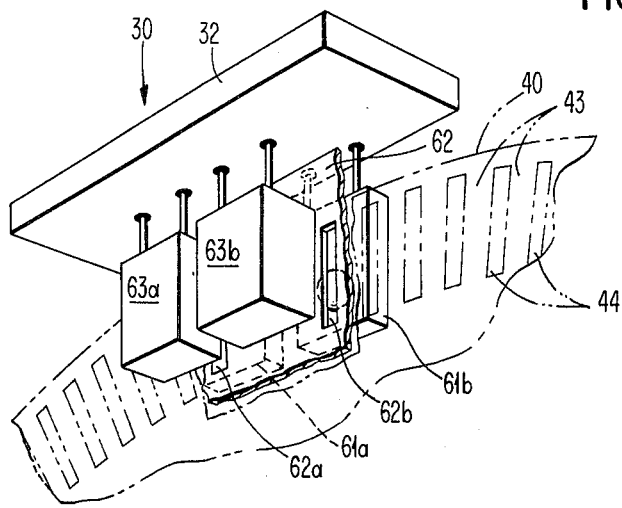
FIG. 3 is a fragmentary, sectional, "worm's eye" view taken along line 3—3 of FIG. 2B and illustrating the relationship between the light sources, light receptors, and slits (mask)

The housing 30 contains a pair of laterally spaced apart light sources 61a, 61b and a complementary pair of spaced apart light receptors 63a, 63b with a pair of slits 62a, 62b (in a mask 62) aligned respectively with the light sources 61 and light receptors 63 (see FIGS. 2 and 3). Each light source 61, light receptor 63 and slit 62a or 62b form an encoder channel. The disc 40 rotates intermediate the light sources 61 and the light receptors 63 for providing a signal output indicating the position, velocity and direction of rotation of the motor shaft 12.

The Structure

In accordance with the invention the optical encoder construction permits for easy and automatic correct axial and radial alignment of the various parts of the encoder. To this end the first side 30a of the housing 30 cooperates with the plate 15 to insure, when in a first position or orientation, that the housing is spaced a predetermined distance "d" (FIG. 2A) from the first side of the plate 15. This is accomplished, in the present instance, by providing spaced apart lugs or cams 16, having a height "d", on the surface or side 30a of the housing. The housing 30 is temporarily latched into this first position. This is accomplished by providing a latch means 20 for coupling the housing 30 to the plate 15.

To this end the latch means 20 comprises a pair of radially spaced apart, circumferentially extending, and axially offset members 21 and 22 (see FIGS. 1 and 2) connected to one of the housing 30 and plate 15, in the present instance connected to the housing 30. Each of the offset members 21 and 22 is dimensioned to fit through slots 19 and 18 respectively in the plate 15 and provide an axial interference fit between the member and the reverse side or surface 15b of the plate 15. As illustrated best in FIG. 1B, the member 21 (and the member 22, although only one member is shown in FIG. 1B) has a two part camming surface 23a and 23b adapted to engage the reverse surface 15b of the plate 15. The lugs 16 bear against the surface 15a of the plate 15, when the plate and housing are in a first position or orientation (see FIG. 2A). In this position the member's first camming surface 23a bears against the plate 15.

The exact rotational position, to insure proper alignment of the apertures 31 of the housing with the apertures 9 of the plate 15, is insured by a pawl or tang 24 which cooperates with a first detent 25 in the slot 19 in the plate 15. The tang 24 is spring loaded radially outward by its arm 24a which presses the tang 24 against the edge 19a of the slot 19. Upon relative rotation of the housing 30 and plate 15, the tang or pawl 24 is biased into the detent 25, and the first camming surface 23a is pressed against the surface 15b of the plate 15. In this manner the tang 24 acts to hold the latch members 21 and 22 in the position illustrated in FIG. 2A.

For reasons which shall become more evident hereinafter, when the plate 15 and housing 30 are in a second position or orientation, (caused by relative rotation of the plate 15 and housing 30) the lugs 16 pass into the apertures or slots 17 in the plate 15. In this position the tang 24 now cooperates with a second detent 26. This places the first side 30a of the housing 30 flush against the first side or surface 15a of the plate 15 and transfers the distance "d" from the first side 30a of the housing 30 to the second side 30b. Additionally, the second camming surface 23b of the members 21 and 22, fully engages the rear surface 15b of the plate 15. The encoder disc 40, as best illustrated in FIGS. 1A and 3, includes a central hub portion 45 coupled to a thin wafer 42 having a circumferentially extending, radially projecting rim portion 42a. The rim portion 42a comprises interdigitated opaque and transparent portions 43 and 44 respectively. The rim portion 42a extends, when in operation, between the light sources 61 (sources 61a and 61b) and the light receptors 63 (receptors 63a and 63b). The light sources 61 and receptors 63 are preferably constructed as described in U.S. patent application Ser. No. 218,513, Cox et al, filed on Dec. 19, 1980, which application is herein incorporated by reference. A mask 62 which includes the slits or mask apertures 62a, 62b is positioned intermediate one of the light sources 61 and receptors 63 and the rim portion 42a of the disc 40. The mask 62, in the illustrated instance, is connected to a circuit board 32 mounting the light sources and receptors 61 and 63 respectively as well as other circuit parts later described.

In order to radially align the disc 40 to the housing 30, and thus to permit radial alignment of the housing relative to the motor shaft 12 of the motor 11, radial alignment means are provided on the hub 45. To this end, the hub 45 includes a conical projection 46 dimensioned at its cylindrical base portion 46a to fit into a precisely located and similarly dimensioned bore 36 in the housing 30. The hub 45 also includes a central passageway 47 dimensioned to receive the shaft 12 of the motor 11. The motor shaft 12 may be connected to the hub 45 in any convenient manner, for example by a friction coupling or as preferable by a barrel like spring clamp such as the clamp 12a.

With the plate 15 latched to the housing 30 in the first position, as heretofore described, the disc 40 is centered with the housing 30, and the thus composed assembly may be slid onto the shaft 12 of the motor 11, the disc 40 being in contact or flush with the surface 30b of the housing 30. When the plate 15 abuts the end housing or casing 13 of the motor 11, the shaft may be connected to the disc hub 45 as described above. The assembly comprising the plate 15 and housing 30 may be rotated until the apertures 31 of the housing 30, the holes 9 in the plate 15 and the apertures 41 in the disc 40 are aligned with tapped holes 13a in the motor casing 13. At this time the screws 14 may be positioned into and through the aforementioned apertures and holes (41, 31 and 9) to fasten the plate 15 to the motor casing 13. The motor then assumes the position shown in FIG. 2A with the disc 40 connected to the motor shaft 12, and flush against the housing 30, while the housing is spaced from the plate 15 the distance "d".

Upon rotation of the housing 30 relative to the plate 15, the lugs or cams 16 pass into the slots 17 pressing the first surface 30a of the housing 30 against the first side or surface 15a of the plate 15. This allows the latch means 20 to effect coupling of the housing 30 to the plate 15 and the transference of the distance "d" to the opposite side 30b of the housing 30. This effects, inasmuch as the disc 40 is fixed to the shaft 12, the spacing of the disc 40 a preset axial distance from the housing 30 and permits repeatable location of the disc 40 with respect to the housing 30 intermediate the light sources 61 and receptors 63. Moreover, by this technique, the replacement of any encoder part and alignment thereof is simple to effect.

In order to inhibit dust and dirt build-up on the disc 40 and housing 30, a dust cover 50 may be employed. The dust cover 50 has a shaft opening 51 and notches 52 for registering with ears 15c. A recessed lip section 53 is configured to cooperate with depending electrical parts of the circuit board 32.

Electro-Optical Considerations

By way of background optical encoders generate digital signals which are employed for measurement and control of linear and rotary motion. Typical incremental encoders with two signal channels (as is the encoder of the present invention) operating at phase quadrature constitute the most popular method of controlling motion. By operating the channels at quadrature, direction sensing for velocities down to zero is possible.

The rotary encoder 10 described above has two such channels comprising the light sources 61 (61a and 61b) and like receptors 63 (receptors 63a, 63b) operating in conjunction with the mask 62, the mask typically serving as a field stop and for setting the proper phase relationship between the two channels.

Figure 4A:
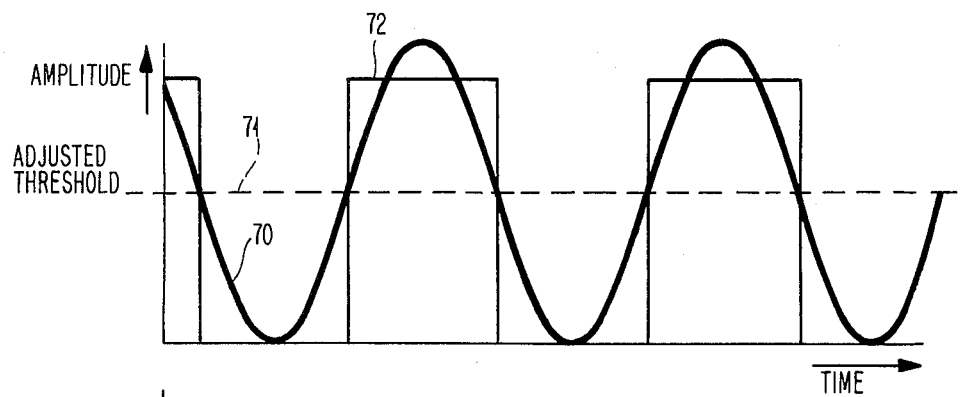
FIGS. 4A and 4B are waveform diagrams illustrating the differences and results of variations of analog signals on resulting digital signals.
Figure 4B:
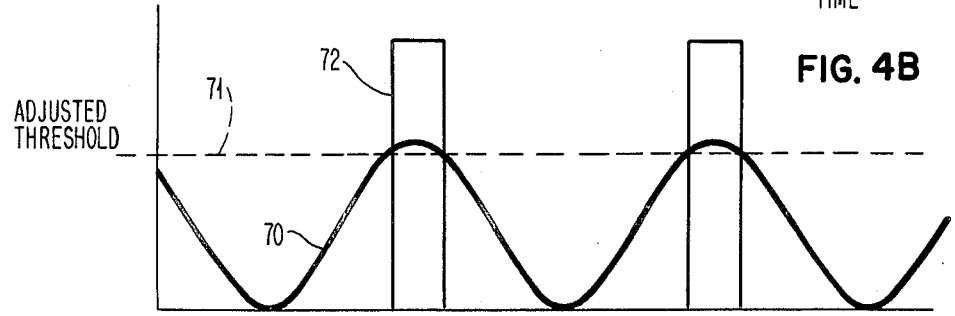

With this type of structure, analog signal amplitude may vary from the time of its initial setting (factory initializing adjustments). This variation is due to component aging, dirt and the like from field operation. With the analog signal amplitude varying, the digital waveform produced thereby and therefrom are greatly effected. This results in gross phase changes. An example of the effect of time, tolerance, drift, temperature, power supply variations etc. is best illustrated in FIGS. 4A and 4B wherein an analog signal 70 is initially adjusted for symmetry (i.e., equal above and below the adjusted threshold line 71) so as to produce digital signals 72 having a pulse width equal to the interception of the threshold line 71 and the analog signal 70. FIG. 4B illustrates, as an example, the effect of temperature causing a drift in the amplification or other efficiencies of typical electrical circuitry. In the instance of FIG. 4B, the analog signal 70 has dropped to approximately 50% of its value in FIG. 4A and the digital signal 72 is of a decreased width due to the decreased amplitude of the analog signal 70 and its position of crossing the threshold 71. The net result of such a decrease in the analog signal and thus a decrease in the width of the digital signal 72, especially when considering two channels operated in phase quadrature, is the signal loss along with the inability, therefore, to discern direction.

Thus it is conventional practice to set the the threshold 71 both at the factory, and later, many times, during service calls. A detection scheme, however, with no adjustments is particularly difficult because large variations of analog signal amplitude cause large phase errors. (It should be recognized that amplitude variation is only one of many sources of phase errors, others would include pattern errors, alignment errors, eccentricity, etc.) Generally, the analog waveform is a varying DC signal which is not symmetrical about a stable reference. Moreover, peak detection for a dynamic reference is difficult to effect in an analog fashion due to the requirements of zero frequency, i.e., that the motor shaft remain stationary for long periods of time. What's more, a no adjustment detection scheme is also difficult to design because of large variations in analog signals will overdrive the amplifier which in turn destroys phase information.

Preferably it is desirable to generate an analog waveform which appears half-wave rectified, utilizing a feedback limiter, and a fixed threshold comparator. This construction, and certain preferred relationships between mask 62 and periodically permit the use of suitable electronics that require no adjustment, either during field replacement or initially. To this end, generation of an analog waveform which appears half-wave rectified will allow the production of a nearly symmetrical digital waveform simply by setting a comparator threshold greatly less than the peak value of the analog waveform. The utilization of a feedback limiter inhibits the amplifier from being overdriven and hence eliminates phase errors caused by excessive saturation recovery time.

Figure 5:
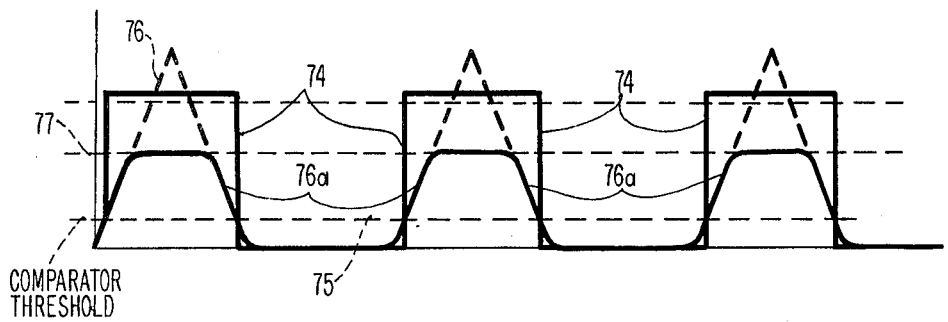
FIG. 5 is a waveform diagram illustrating the generation of a "half-wave rectified waveform" which may be employed to form a symmetrical digital waveform.

By designing for a minimum (including drift) worse case peak analog voltage greater, by a considerable amount, than the maximum comparator threshold, a symmetrical digital waveform may be developed for all values of analog voltage above some predetermined minimum value. In this manner, the requirement for initial (or field) adjustments on either the analog signal or the comparator threshold may be eliminated. FIG. 5 illustrates diagrammatically a nearly symmetrical digital output waveform 74 with a relatively low comparator threshold 75 for operation with analog voltage waveforms 76, in the illustrated instance having a minimum peak voltage as shown in FIG. 5. The limiter value, as shall be shown hereinafter in the electrical schematic of FIG. 8, will permit the limiting of the analog voltage to the limited analog waveform 76a by the limiter value 77. This type of limitation will enhance the circuit operation to prevent phase errors due to amplifier saturation (i.e., the inability of saturated amplifier circuitry to recover).

As heretofore set forth, the mask 62 with its spaced apart slits 62a, 62b are aligned with the light sources 61 (61a, 61b) and the light receptors (receptors 63a, 63b), the mask serving as a field stop and for setting the proper phase relationship between the two channels. In order to produce the desired analog waveform, and in the preferred form of the present invention, the convolution of the stationary mask 62 and the rotating disc 40 apertures must create what appears to be or is apparently a "half-wave rectified waveform." In order to accomplish this, it is desirable that the design of the aperture for the mask opening (i.e., the width of the slots or apertures 62a, 62b) plus the width of the disc opening (i.e., the width of the transparent aperture 44) equal the period of the disc pattern divided by two.

This relationship is illustrated best in FIG. 6 wherein P equals the period of the disc pattern, i.e., one transparent and one opaque portion, 44, 43 of the rim 42a. In the example of FIG. 6, which is the preferred embodiment, the mask opening, i.e., the width of the slots 62a or 62b, is equal to the transparent portion width, in the illustrated instance P/4. As may be noted, two times P/4 equals P/2 thereby meeting the requirement that the mask opening plus the disc opening should be equal to the period of the disc pattern divided by 2. For information purposes, this produces an analog waveform (or convolution) 80 such as illustrated in the lower portion of FIG. 6 with the width of the waveform equal to, of course, the period of the disc pattern divided by 2 (i.e., P/2). The particular pattern illustrated is similar to that described in U.S. Pat. No. 3,723,748. However, it should be recognized that other openings and ratios may exist between the mask opening and still achieve the desired result. For example and as best illustrated in FIG. 7, the transparent opening 44 in the disc pattern is twice the mask slot 62a (or 62b) opening. Thus the width of the disc transparent portion opening 44 is P/3 while the mask opening is P/6. Simple addition of P/3 plus P/6 once again meets the requirement that the mask opening plus the disc opening equal the period of the disc pattern divided by two. In this connection, the convolution or waveform illustrated in the lower portion of FIG. 7 (analog waveform 81) is the waveform produced from the disc pattern wherein the transparent openings are equal to P/3 and the mask pattern openings or widths are equal to P/6.

A typical circuit which may be employed to obtain a useful output from the encoder of the present invention is illustrated in FIG. 8. It should be recognized that only one channel of the two channel encoder described heretofore is illustrated, the second channel of circuitry being identical. As illustrated in FIG. 8, the light source 61 may be composed of a light emitting diode D1 while the light receptor 63 is photodiode D3, the diode D3 is coupled to the input of an operational amplifier Q1. As is conventional practice, the resistor R3 (in the present invention large) sets the gain of the operational amplifier Q1.

A second feedback loop, (which does not contain the large feedback resistor) enhances the circuit and permits a faster circuit response than would be possible by limiting in the loop containing R3, while allowing for feedback limiting. To this end the output voltage of the amplifier is fed back to control the input LED or light source current, and hence light output during each diode cycle. The output of the operational amplifier Q1 is also fed through a resistor R5 to a comparator Q3 having a standard and rather conventional design. For example purposes only, the following listing of resistors and parts may be employed:

R1 = 294 ohms
R3 = 5.1 mohms
R5 = 7.5 kohms
R7 = 25.5 kohms
R8 = 3.48 kohms
R9 = 180 kohms
R11 = 5.1 kohms
C1 = 0.01 uF
C3(Intrinsic) = 1-2 PF.
D1(61) = IRLED (OP140SLA)
D3 = photodiode (TIL 100)
Q1 = dual FET opamp LF353 (National Semiconductor)
Q3 = quad comparator (MC3302) (Motorola).

Thus the apparatus of the present invention permits of quick mounting and attachment to a rotating shaft, in the illustrated instance a motor, for operation as a shaft decoder without necessitating radial or axial adjustments thereof. Moreover, with the mask and disc design wherein the relationship between the period of the mask and the combined widths of the mask slit or transparency and the disc transparency equals the period divided by two, a truly unique encoder requiring no mechanical or electrical adjustments during use, or after part repair or replacement is provided.

Although the invention has been described with a certain degree of particularity, it is understood that the present disclosure has been made only by way of example and that numerous changes in the details of construction and the combination and arrangement of parts may be made without departing from the spirit and scope of the invention as hereinafter claimed.

What is claimed is:

1. A modular shaft encoder for mounting on a rotating shaft supported by a casing, comprising in combination: a plate for attachment to said casing and having an aperture therein dimensioned for circumscribing said shaft; a housing containing a pair of spaced apart light sources and a complimentary pair of spaced apart light receptors, and a mask having slits aligned respectively intermediate said sources and receptors; an axially extending bore in said housing dimensioned for circumscribing said shaft and for alignment with the aperture in said plate; an encoder disc having a central, axially extending bore and a plurality of radially and circumferentially extending interdigitated transparent and opaque portions on said disc and positioned to rotate, when said disc is mounted on said shaft, intermediate said light sources and light receptors; means on said disc for radially aligning said disc with said housing, so that said portions are positioned intermediate said light sources and light receptors; means for latching said housing to said plate in a first position spaced a predetermined distance from said plate; and means for shifting the housing from said first position to a second position wherein said housing is adjacent said plate thereby transferring said predetermined distance from one side of said housing to the other side of said housing.

2. A modular shaft encoder in accordance with claim 1 wherein one of said housing and said plate includes spacer means for spacing said plate and housing from each other said predetermined distance when latched in said first position.

3. A modular shaft encoder in accordance with claim 2 wherein said spacer means comprise lugs.

4. A modular shaft encoder in accordance with claims 1 or 2 or 3 including recessed slots in the other of said plate and housing so that when said plate and housing are in a second position, said lugs are in said recessed slots.

5. A modular shaft encoder in accordance with claim 1 wherein said means for latching includes means for latching said plate to said housing in said second position.

6. A modular shaft encoder in accordance with claim 1 or 5 wherein said means for latching comprises a pair of radially spaced apart, circumferentially extending and axially offset members connected to one of the housing and plate, and slot means in the other of said plate and housing for interacting with said means for latching one to the other.

7. A modular shaft in accordance with claim 6 including a two part camming surface associated with each of said latch members for latching in each of said first and second positions.

8. A modular shaft encoder in accordance with claim 7 including a pawl or tang associated with said latch means, and a first and second detent associated with said cooperating slot for engagement in said first and second positions respectively.

9. A modular shaft encoder in accordance with claim 1 wherein the sum of the width of a slit and a transparent portion is equal to one-half the period of said transparent and opaque portion.

10. A modular shaft encoder in accordance with claim 9 including an operational amplifier connected to said light receptor, and a feed back loop to said light source to control the current through said light source to thereby inhibit saturation of said operational amplifier.

11. A modular shaft encoder in accordance with claim 10 wherein each of said slits and each of said transparent portions has a width of the period of said transparent and opaque openings divided by four.

12. A modular shaft encoder in accordance with claim 10 wherein the width of said slits and the width of said transparent portions are different.

13. A method of assemblying and operating a two channel rotary encoder, comprising the steps of:
latching a mounting plate to a housing a predetermined and preset distance from a first side thereof;
abutting a rotatable encoder disc against an opposite side of said housing;
securing the mounting plate to the casing of a motor and securing the encoder disc to the shaft of said motor;
shifting the housing into abutting engagement with said plate and thereby transferring said predetermined and preset distance to the opposite side of said housing intermediate said encoder disc and said housing.

14. A method of assemblying and operating a two channel rotary encoder in accordance with claim 13 including the step of latching said mounting plate to said housing upon shifting occurring.

15. A modular shaft encoder for mounting on the shaft of a motor, comprising in combination:

a plate for attachment to the motor and having an aperture therein dimensioned for circumscribing the shaft of said motor;
a housing containing a pair of spaced apart light sources and a complimentary pair of spaced apart light receptors, and a pair of slits aligned respectively with said light sources and light receptors, and an axially extending bore in said housing and dimensioned for circumscribing the shaft of the motor and in alignment with the aperture in said plate;
a disc having a central, axially extending bore;
a plurality of radially and circumferentially extending interdigitated transparent and opaque portions on said disc and positioned to rotate, when said disc is mounted on the shaft of said motor, intermediate said light sources and light receptors;
means on said disc for automatically radially aligning, when said disc is positioned in abutting relationship with a first side of said housing, said portions intermediate said light sources and light receptors;
latch means on one of said plate and a second side of said housing and spacer means on one of said plate and said second side of said housing, said latch means operable between a first and second position, said first position operable to couple said housing to said plate with said spacer means interposed intermediate said plate and housing and operative to space said housing from said plate a predetermined distance;
said latch means operable, when in said second position to cam said housing into abutting contact with said plate to thereby transfer said predetermined distance from said second side of said housing adjacent said plate to the first side of said housing adjacent said disc, whereby axial alignment of said disc with respect to said housing is achieved.

* * * * *